United States Patent
Shih et al.

(10) Patent No.: US 10,566,320 B2
(45) Date of Patent: Feb. 18, 2020

(54) METHOD FOR FABRICATING ELECTRONIC PACKAGE

(71) Applicant: Siliconware Precision Industries Co., Ltd., Taichung (TW)

(72) Inventors: Chi-Liang Shih, Taichung (TW); Chun-Chong Chien, Taichung (TW); Hsin-Lung Chung, Taichung (TW); Te-Fang Chu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 16/211,714

(22) Filed: Dec. 6, 2018

(65) Prior Publication Data

US 2019/0115330 A1   Apr. 18, 2019

Related U.S. Application Data

(62) Division of application No. 14/981,479, filed on Dec. 28, 2015, now Pat. No. 10,181,458.

(51) Int. Cl.
*H01L 21/56* (2006.01)
*H01L 25/16* (2006.01)
(Continued)

(52) U.S. Cl.
CPC .............. *H01L 25/16* (2013.01); *H01L 21/56* (2013.01); *H01L 23/3121* (2013.01);
(Continued)

(58) Field of Classification Search
CPC ..... H01L 2224/48091; H01L 2924/181; H01L 2924/00012; H01L 2924/00014; H01L 21/56; H01L 2224/16225; H01L 2224/48227; H01L 23/3121; H01L 23/5386; H01L 23/552; H01L 25/16;
(Continued)

(56) References Cited

U.S. PATENT DOCUMENTS

| | | | |
|---|---|---|---|
| 2004/0113281 A1* | 6/2004 | Brandenburg | .......... H01L 21/56 257/778 |
| 2005/0093144 A1* | 5/2005 | Brandenburg | .......... H01L 21/56 257/723 |

(Continued)

*Primary Examiner* — Long K Tran
(74) *Attorney, Agent, or Firm* — Mintz Levin Cohn Ferris Glovsky and Popeo, P.C.; Peter F. Corless; Steven M. Jensen

(57) ABSTRACT

An electronic package is provided, including: a substrate having opposite first and second surfaces; at least a first electronic element disposed on the first surface of the substrate; a first encapsulant encapsulating the first electronic element; at least a second electronic element and a frame disposed on the second surface of the substrate; and a second encapsulant encapsulating the second electronic element. By disposing the first and second electronic elements on the first and second surfaces of the substrate, respectively, the invention allows a required number of electronic elements to be mounted on the substrate without the need to increase the surface area of the substrate. Since the volume of the electronic package does not increase, the electronic package meets the miniaturization requirement. The present invention further provides a method for fabricating the electronic package.

6 Claims, 8 Drawing Sheets

(51) Int. Cl.
*H01L 25/00* (2006.01)
*H01L 23/552* (2006.01)
*H01L 23/31* (2006.01)
*H01L 23/498* (2006.01)
*H01L 23/538* (2006.01)

(52) U.S. Cl.
CPC ............ *H01L 23/552* (2013.01); *H01L 25/50* (2013.01); *H01L 23/49816* (2013.01); *H01L 23/5383* (2013.01); *H01L 2224/16225* (2013.01); *H01L 2224/32145* (2013.01); *H01L 2224/48091* (2013.01); *H01L 2224/48227* (2013.01); *H01L 2224/97* (2013.01); *H01L 2924/15192* (2013.01); *H01L 2924/15311* (2013.01); *H01L 2924/181* (2013.01); *H01L 2924/19105* (2013.01); *H01L 2924/19106* (2013.01); *H01L 2924/3025* (2013.01)

(58) Field of Classification Search
CPC ........... H01L 25/50; H01L 2924/15311; H01L 2924/19105
See application file for complete search history.

(56) References Cited

U.S. PATENT DOCUMENTS

2009/0166835 A1* 7/2009 Yang ................... H01L 21/565
257/686
2010/0133675 A1* 6/2010 Yu ..................... H01L 23/49833
257/686

* cited by examiner

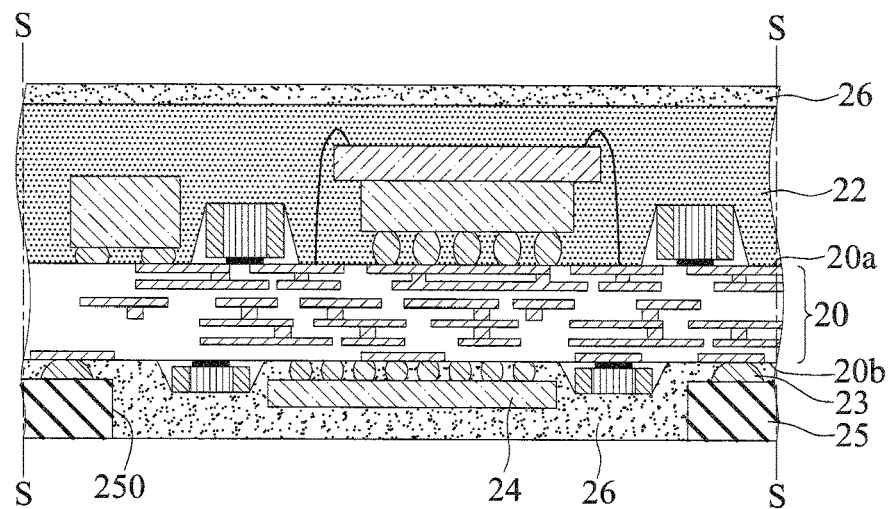
FIG. 2D
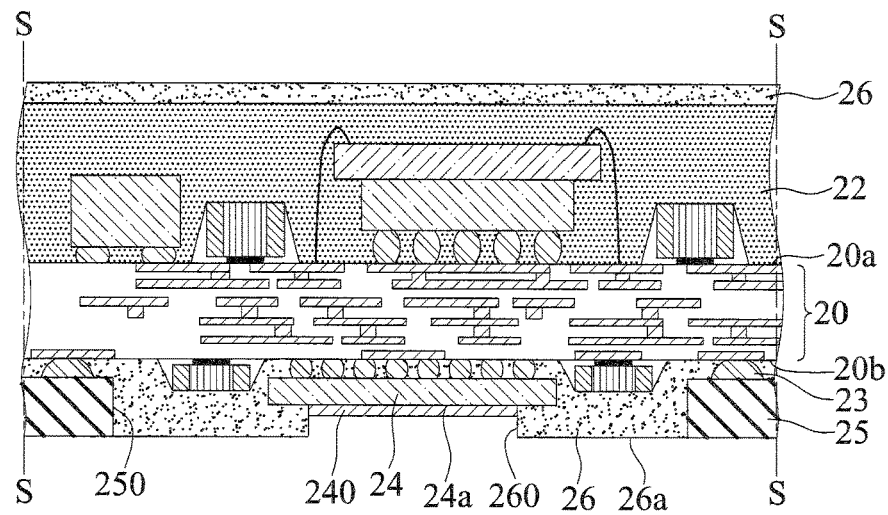
FIG. 2D'
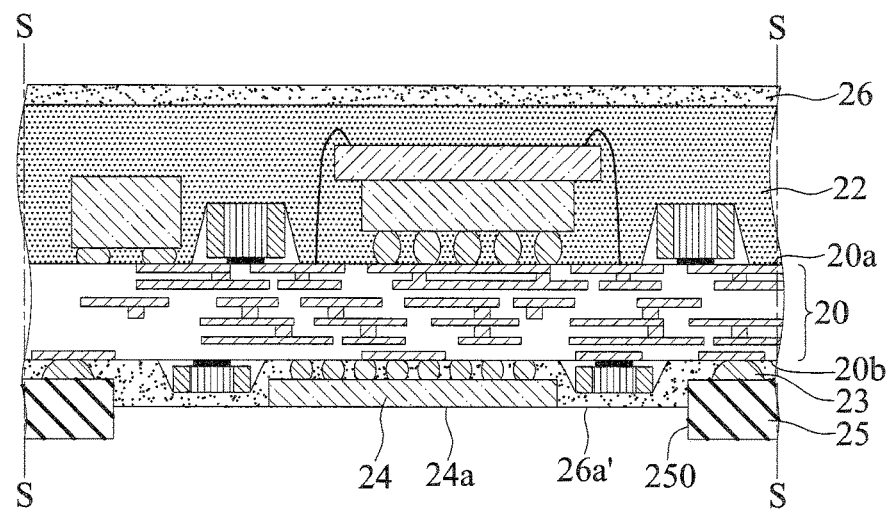
FIG. 2D"

METHOD FOR FABRICATING ELECTRONIC PACKAGE

CROSS-REFERENCE TO RELATED APPLICATION(S)

This application is a divisional of copending application U.S. Ser. No. 14/981,479, filed on Dec. 28, 2015, which claims under 35 U.S.C. § 119(a) the benefit of Taiwanese Application No. 104125072, filed Aug. 3, 2015, the entire contents of which are incorporated herein by reference.

BACKGROUND OF THE INVENTION

1. Field of the Invention

The present invention relates to electronic packages, and more particularly, to an electronic package having a reduced size and a fabrication method thereof.

2. Description of Related Art

Along with the rapid development of electronic industries, electronic products are developed toward the trend of miniaturization and high speed. Particularly, communication technologies are integrated in various kinds of electronic products such as cell phones and laptops.

To improve the performance and capacity of single semiconductor packages so as to meet the miniaturization requirement, multichip modules have been widely applied. That is, two or more chips are integrated in a single package so as to reduce the volume of the overall circuit structure and improve the electrical performance.

FIG. 1 is a schematic perspective view of a conventional semiconductor package 1. Referring to FIG. 1, the semiconductor package 1 has a substrate 10, a plurality of semiconductor chips 11 and passive elements 12 disposed on a surface of the substrate 10, and an encapsulant (not shown) encapsulating the semiconductor chips 11 and the passive elements 12.

However, in the conventional semiconductor package 1, the semiconductor chips 11 and the passive elements 12 occupy a large surface area of the substrate 10, thus increasing the volume of the semiconductor package 1 and hindering miniaturization of the semiconductor package 1.

Therefore, how to overcome the above-described drawbacks has become critical.

SUMMARY OF THE INVENTION

In view of the above-described drawbacks, the present invention provides an electronic package, which comprises: a substrate having a first surface and a second surface opposite to the first surface; at least first electronic element disposed on the first surface of the substrate; a first encapsulant formed on the first surface of the substrate to encapsulate the first electronic element; at least a second electronic element disposed on the second surface of the substrate; a frame disposed on the second surface of the substrate; and a second encapsulant formed on the second surface of the substrate to encapsulate the second electronic element.

The present invention further provides a method for fabricating an electronic package, which comprises the steps of: providing a substrate having a first surface and a second surface opposite to the first surface; disposing at least a first electronic element on the first surface of the substrate and forming a first encapsulant on the first surface of the substrate to encapsulate the first electronic element; disposing at least a second electronic element on the second surface of the substrate; bonding a frame to the second surface of the substrate; and forming a second encapsulant on the second surface of the substrate to encapsulate the second electronic element.

In the above-described package and method, the frame can have an opening exposing the second electronic element.

In the above-described package and method, the frame can be a metal frame or a circuit board.

In the above-described package and method, the frame can be disposed on the second surface of the substrate through a plurality of conductors.

In the above-described package and method, the second electronic element can have a surface exposed from the second encapsulant.

In the above-described package and method, a shielding layer can be formed on the second encapsulant.

In the above-described package and method, a plurality of conductive elements can further be formed on the frame.

Therefore, by disposing the first and second electronic elements on the first and second surfaces of the substrate, respectively, the present invention allows a required number of electronic elements to be mounted on the substrate without the need to increase the surface area of the substrate. Since the volume of the electronic package does not increase, the electronic package of the present invention meets the miniaturization requirement.

Further, the first encapsulant and the second encapsulant constitute a double-layer structure that protects the electronic elements from being damaged by external moisture or pollutants.

Furthermore, the double-layer structure of the first encapsulant and the second encapsulant increases the impact resistance and reduces the risk of cracking of the electronic package, and prolongs the lifetime of the electronic package operating in a high-temperature high-humidity environment.

In addition, the shielding layer protects the first electronic element and the second electronic element from being adversely affected by electromagnetic interferences, thereby ensuring proper operation of the electronic package.

BRIEF DESCRIPTION OF DRAWINGS

FIGS. 2A to 2E are schematic cross-sectional views showing a method for fabricating an electronic package according to the present invention, wherein FIG. 2C' is a schematic partial perspective view of FIG. 2C, FIGS. 2D' and 2D" show other embodiments of FIG. 2D, FIG. 2E' shows another embodiment of FIG. 2E, and FIG. 2E" is a schematic partial perspective view of FIG. 2E';

FIGS. 3A' to 3D' are schematic planar views of conductive elements of the electronic package of the present invention.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2E are schematic cross-sectional views showing a method for fabricating an electronic package 2 according to the present invention.

Figure 1:
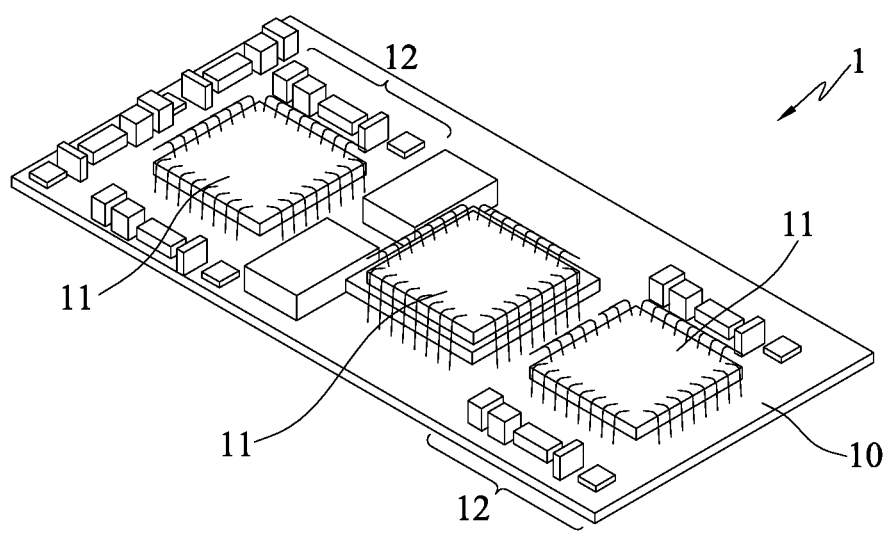
FIG. 1 is a schematic perspective view of a conventional electronic device.
Figure 2A:
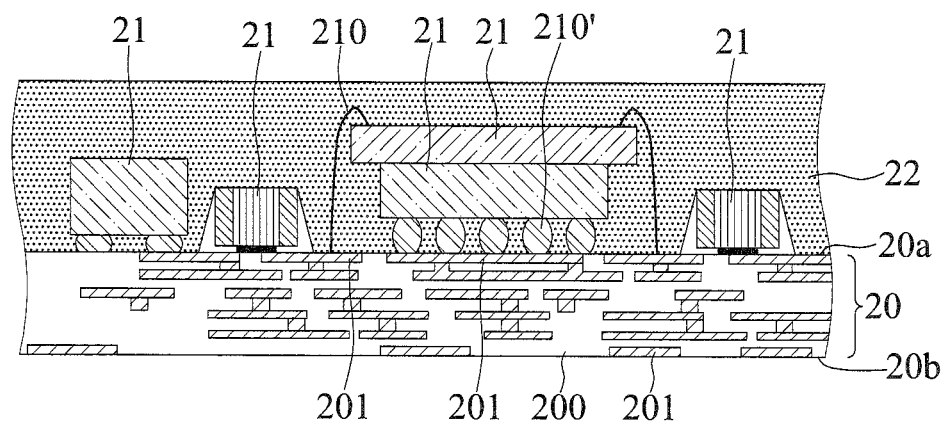

Referring to FIG. 2A, a substrate 20 having a first surface 20a and a second surface 20b opposite to the first surface 20a is provided. A plurality of first electronic elements 21 are disposed on the first surface 20a of the substrate 20 and a first encapsulant 22 is formed on the first surface 20a of the substrate 20 for encapsulating the first electronic elements 21.

In the present embodiment, the substrate 20 is a circuit board, which has, for example, at least a dielectric layer 200 and a circuit layer 201 formed on the dielectric layer 200.

Each of the first electronic elements 21 is an active element such as a semiconductor chip, a passive element such as a resistor, a capacitor or an inductor, or a combination thereof.

The first electronic elements 21 are electrically connected to the circuit layer 201 of the substrate 20. The first electronic elements 21 can be electrically connected to the circuit layer 201 through bonding wires 210 or through a plurality of solder bumps 210'.

The first encapsulant 22 is made of polyimide, a dry film, an epoxy resin or a molding compound.

Figure 2B:
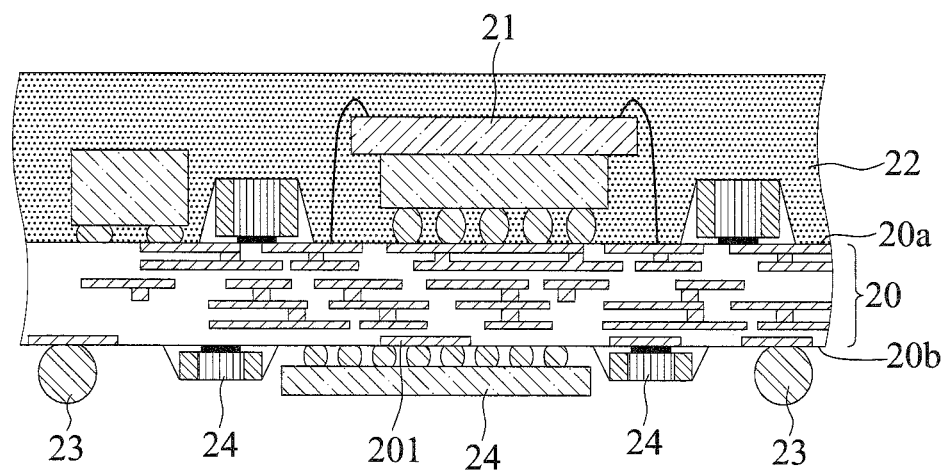

Referring to FIG. 2B, a plurality of conductors 23 are formed on the second surface 20b of the substrate 20 and a plurality of second electronic elements 24 are disposed on the second surface 20b of the substrate 20.

In the present embodiment, the conductors 23 are solder bumps or conductive posts such as copper posts. The conductors 23 are electrically connected to the circuit layer 201 of the substrate 20.

Each of the second electronic elements 24 is an active element such as a semiconductor chip, a passive element such as a resistor, a capacitor or an inductor, or a combination thereof.

The second electronic elements 24 are electrically connected to the circuit layer 201 of the substrate 20. The second electronic elements 24 can be electrically connected to the circuit layer 201 in a flip-chip manner or through wire bonding (not shown).

Figure 2C:
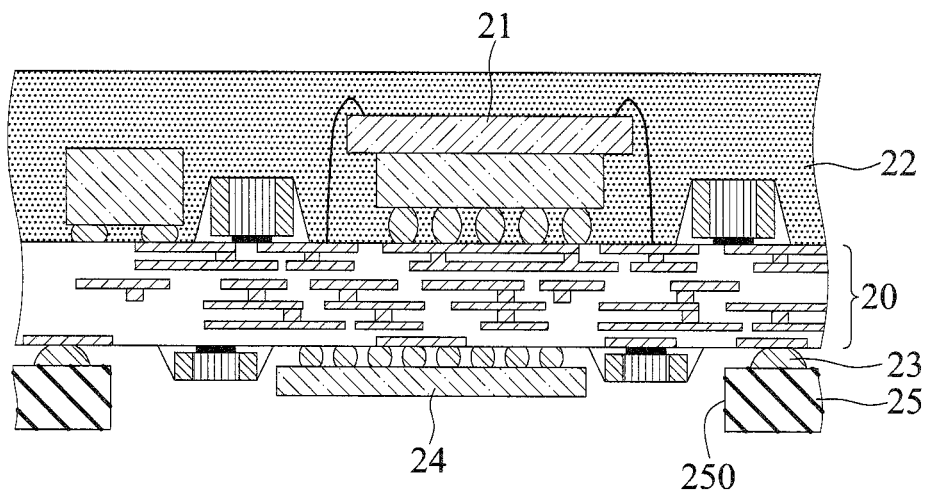
Figure 2C:
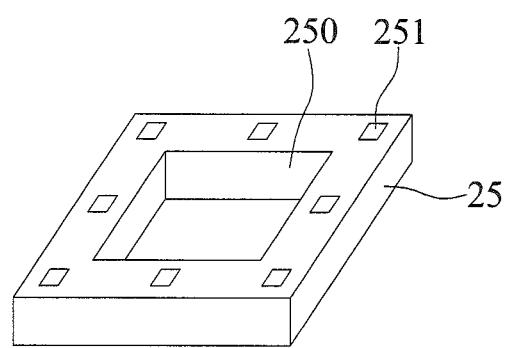

Referring to FIG. 2C, a frame 25 is bonded to and electrically connected to the conductors 23.

In the present embodiment, the frame 25 is a metal frame or a circuit board according to the practical requirement.

The second electronic elements 24 are exposed from the frame 25. For example, referring to FIG. 2C', the frame 25 has at least an opening 250 and a plurality of contacts 251. The second electronic elements 24 are exposed from the opening 250 and the contacts 251 are correspondingly bonded to the conductors 23. FIGS. 3A to 3E show different embodiments of the frame. For example, referring to FIG. 3E, the frame consists two bar portions, which can be longitudinally or horizontally oriented relative to the substrate 20.

Referring to FIG. 2D, a second encapsulant 26 is formed on the second surface 20b of the substrate 20 to encapsulate the second electronic elements 24, the first encapsulant 22 and the conductors 23.

In the present embodiment, the second encapsulant 26 is made of polyimide, a dry film, an epoxy resin or a molding compound. The second encapsulant 26 and the first encapsulant 22 can be made of the same or different materials.

The second encapsulant 26 is further formed in the opening 250 of the frame 25 to cover the second electronic elements 24. In another embodiment, referring to FIG. 2D', the second encapsulant 26 has an opening 260 formed in a surface 26a thereof and one of the second electronic elements 24 has a surface 24a exposed from the surface 26a of the second encapsulant 26 through the opening 260.

Alternatively, referring to FIG. 2D", the surface 24a of the second electronic element 24 is exposed from and flush with the surface 26a' of the second encapsulant 26. In this embodiment, the surface of the frame 25 can be optionally flush with (not shown) or not flush with the surface 26a' of the second encapsulant 26.

Further, if the surface 24a of the second electronic element 24 is exposed from the surface 26a, 26a' of the second encapsulant 26, a heat dissipating structure such as a heat dissipating layer 240 made of metal or a heat sink known in the art can be formed on the exposed surface of the second electronic element 24, as shown in FIG. 2D'.

Figure 2E:
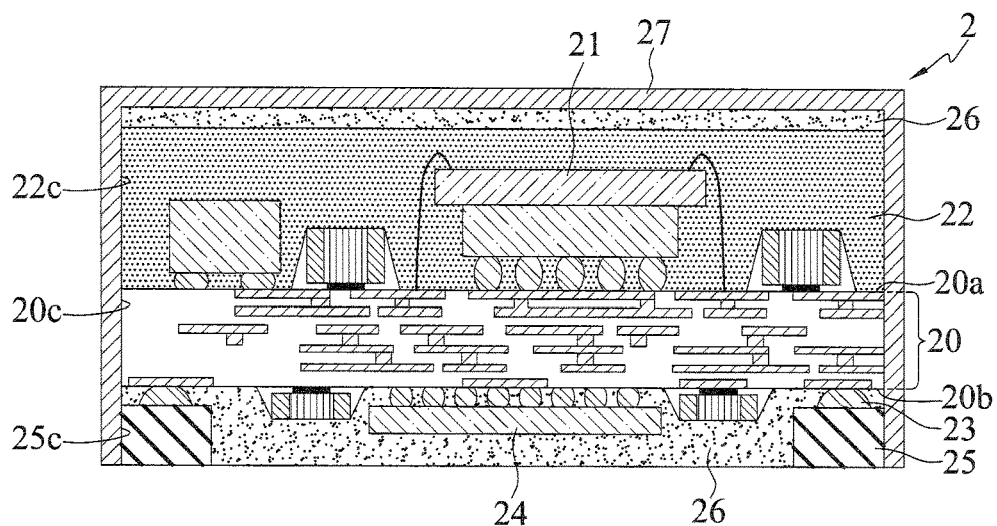
Figure 2E:
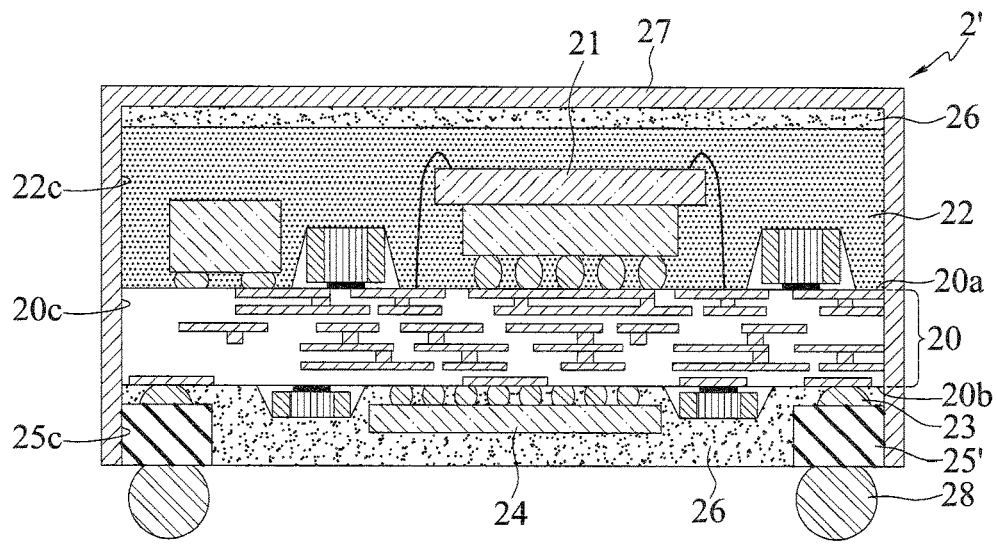
Figure 2E:
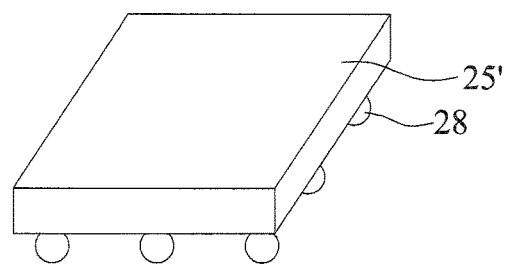
Figure 3A:
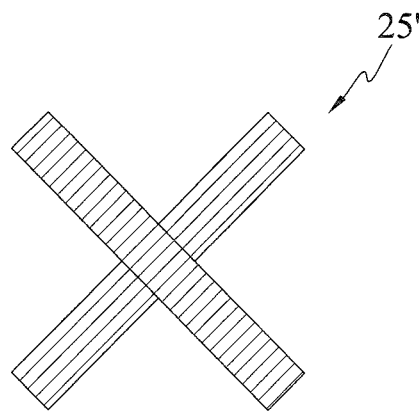
FIGS. 3A to 3E are schematic views of a frame of the electronic package according to different embodiments of the present invention.
Figure 3A:
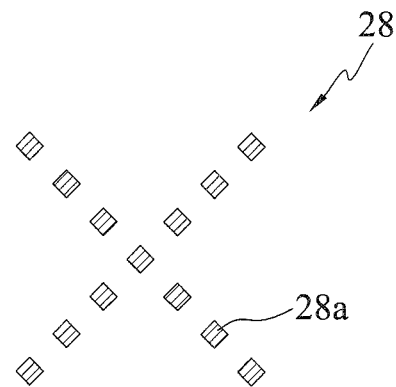
Figure 3B:
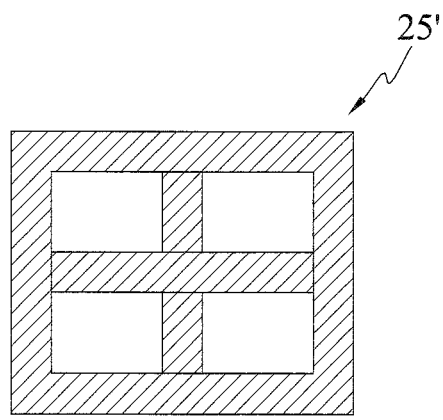
Figure 3B:
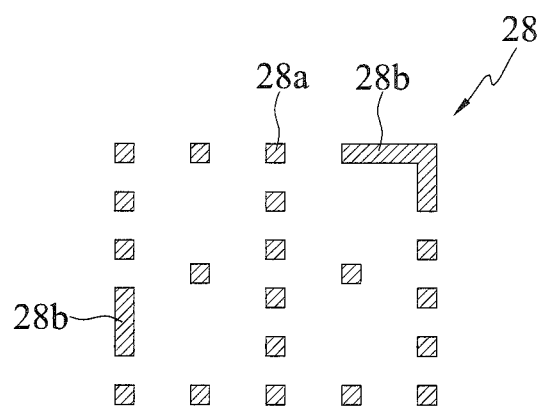
Figure 3C:
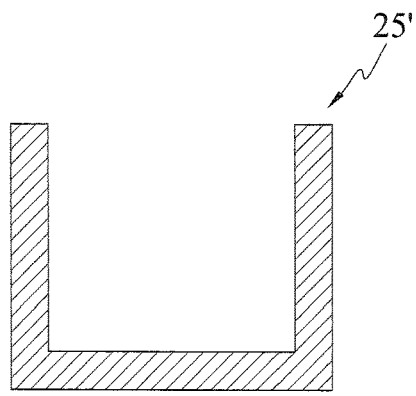
Figure 3C:
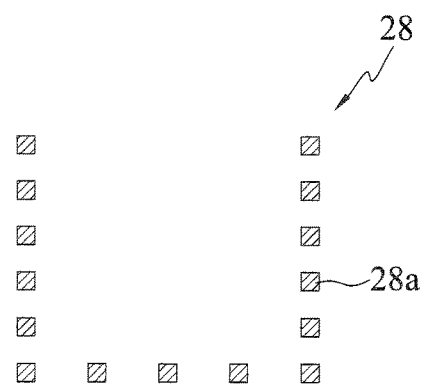
Figure 3D:
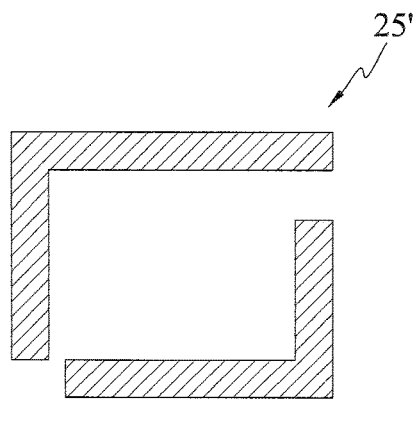
Figure 3D:
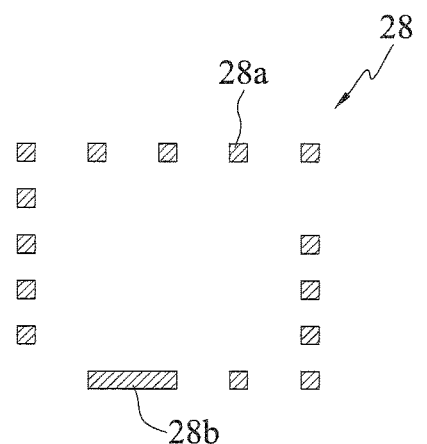
Figure 3E:
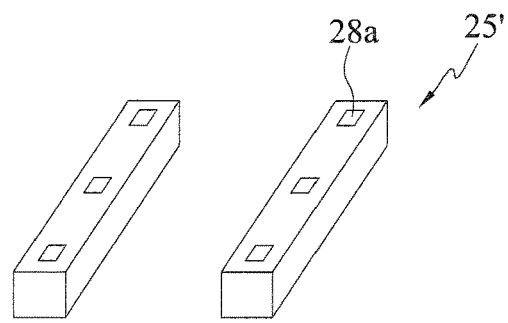

Referring to FIG. 2E, a shielding layer 27 is formed on the second encapsulant 26. The shielding layer 27 is a metal layer, for example, a copper layer.

In the present embodiment, before formation of the shielding layer 27, a singulation process is performed along cutting paths S of FIG. 2D. As such, the shielding layer 27 is formed to extend on side surfaces 22c of the first encapsulant 22, side surfaces 20c of the substrate 20 and side surfaces 25c of the frame 25.

Further, referring to FIG. 2E, if the electronic package 2 is of a land grid array (LGA) type, the frame 25 is a metal frame with a plurality of leads.

Figure 4A:
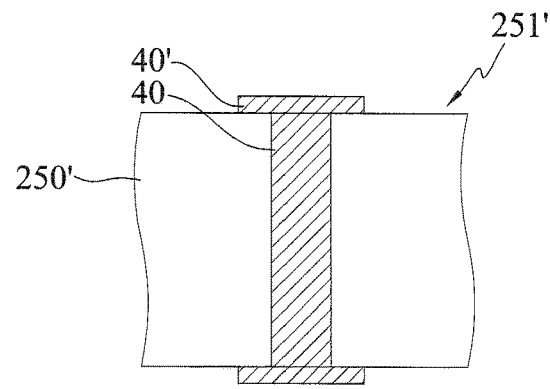
FIGS. 4A to 4C are schematic cross-sectional views showing the structure of the frame according to different embodiments of the present invention.
Figure 4B:
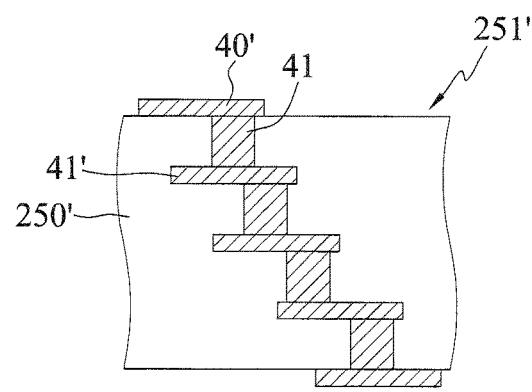
Figure 4C:
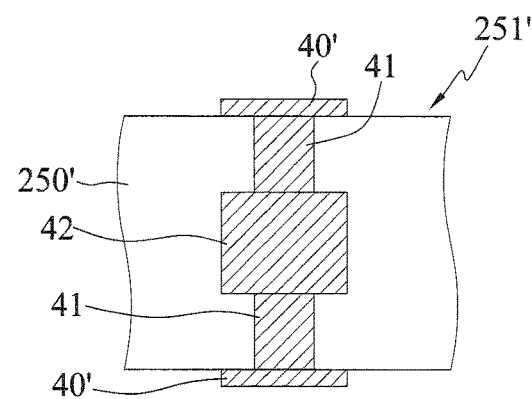

Referring to FIG. 2E', if the electronic package 2' is of a ball grid array (BGA) type, the frame 25' is a circuit board electrically connected to a plurality of conductive elements 28. FIGS. 4A to 4C show the structure of the frame 25' according to different embodiments of the present invention. Referring to FIGS. 4A to 4C, the frame 25' has at least a dielectric layer 250' and a circuit layer 251' formed on the dielectric layer 250'. In particular, referring to FIG. 4A, the circuit layer 251' has a plurality of conductive through holes 40 and a plurality of conductive pads 40' correspondingly formed on the conductive through holes 40, thus forming a double-layer structure. In another embodiment, referring to FIG. 4B, the circuit layer 251' has a plurality of conductive vias 41 and a plurality of circuits 41' alternately arranged to form a built-up structure. In a further embodiment, referring to FIG. 4C, the circuit layer 251' has a metal core layer 42 and a plurality of conductive vias 41 arranged to form a built-up structure. The circuit layer 251' is arranged in such a manner that the shielding layer 27 is easy to contact with the circuit layer 251' on the side surfaces 25c of the frame 25, thereby improving the shielding effect.

Further, the conductive elements 28 are formed on the frame 25' before formation of the shielding layer 27. The conductive elements 28 are solder bumps, pins or conductive posts such as copper posts. The conductive elements 28 are arranged corresponding to the shape of the frame 25', as shown in FIGS. 2E″, 3A′ to 3D′ and 3E. The conductive elements 28 are in shape of points 28a, strips 28b or a combination thereof.

According to the present invention, the first electronic elements 21 and the second electronic elements 24 are disposed on the first surface 20a and the second surface 20b of the substrate 20, respectively. As such, the present invention allows a required number of electronic elements to be mounted on the substrate 20 without the need to increase the surface area of the substrate 20. Since the volume of the electronic package 2, 2′ does not increase, the electronic package 2, 2′ of the present invention meets the miniaturization requirement.

Further, the first encapsulant 22 and the second encapsulant 26 constitute a double-layer structure that protects the first and second electronic elements 21, 24 from being damaged by external moisture or pollutants.

Furthermore, the double-layer structure of the first encapsulant 22 and the second encapsulant 26 increases the impact resistance and reduces the risk of cracking of the electronic package 2, 2′, and prolongs the lifetime of the electronic package 2, 2′ operating in a high-temperature high-humidity environment.

In addition, the shielding layer 27 protects the first and second electronic element 21, 24 from being adversely affected by electromagnetic interferences, thereby ensuring proper operation of the electronic package 2, 2′.

The present invention further provides an electronic package 2, 2′, which has: a substrate 20 having a first surface 20a and a second surface 20b opposite to the first surface 20a; at least a first electronic element 21 disposed on the first surface 20a of the substrate 20; a first encapsulant 22 formed on the first surface 20a of the substrate 20 to encapsulate the first electronic element 21; at least a second electronic element 24 disposed on the second surface 20b of the substrate 20; a frame 25, 25′ disposed on the second surface 20b of the substrate 20; and a second encapsulant 26 formed on the second surface 20b of the substrate 20 to encapsulate the second electronic element 24.

In an embodiment, the frame 25, 25′ has at least an opening 250 exposing the second electronic element 24.

In an embodiment, the frame 25 is a metal frame.

In an embodiment, the frame 25′ is a circuit board.

In an embodiment, the frame 25, 25′ is disposed on the second surface 20b of the substrate 20 through a plurality of conductors 23.

In an embodiment, the second electronic element 24 has a surface 24a exposed from the second encapsulant 26.

In an embodiment, the electronic package 2, 2′ further has a shielding layer 27 formed on the second encapsulant 26.

In an embodiment, the electronic package 2′ further has a plurality of conductive elements 28 formed on the frame 25′.

Therefore, by disposing the first and second electronic elements on the first and second surfaces of the substrate, respectively, the present invention allows a required number of electronic elements to be mounted on the substrate without the need to increase the surface area of the substrate. Since the volume of the electronic package does not increase, the electronic package of the present invention meets the miniaturization requirement.

Further, the first encapsulant and the second encapsulant constitute a double-layer structure that protects the first and second electronic elements from being damaged by external moisture or pollutants.

Furthermore, the double-layer structure of the first encapsulant and the second encapsulant increases the impact resistance and reduces the risk of cracking of the electronic package, and prolongs the lifetime of the electronic package operating in a high-temperature high-humidity environment.

In addition, the shielding layer protects the first electronic element and the second electronic element from being adversely affected by electromagnetic interferences, thereby ensuring proper operation of the electronic package.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating an electronic package, comprising the steps of:
providing a substrate having a first surface and a second surface opposite to the first surface;
disposing at least a first electronic element on the first surface of the substrate and forming a first encapsulant on the first surface of the substrate to encapsulate the first electronic element;
disposing at least a second electronic element on the second surface of the substrate;
bonding a frame to the second surface of the substrate;
forming a second encapsulant on the second surface of the substrate to encapsulate the second electronic element, wherein the second encapsulant is further formed on and in direct contact with the first encapsulant to encapsulate the first electronic element; and
forming a shielding layer on the second encapsulant formed on and in direct contact with the first encapsulant.

2. The method of claim 1, wherein the frame has an opening exposing the second electronic element.

3. The method of claim 1, wherein the frame is a metal frame or a circuit board.

4. The method of claim 1, wherein the frame is disposed on the second surface of the substrate through a plurality of conductors.

5. The method of claim 1, wherein the second electronic element has a surface exposed from the second encapsulant.

6. The method of claim 1, further comprising forming a plurality of conductive elements on the frame.

* * * * *